(12) United States Patent
Lee et al.

(10) Patent No.: US 12,532,723 B2
(45) Date of Patent: Jan. 20, 2026

(54) SCALABLE PATTERNING THROUGH LAYER EXPANSION PROCESS AND RESULTING STRUCTURES

(71) Applicant: Taiwan Semiconductor Manufacturing Co., Ltd., Hsinchu (TW)

(72) Inventors: Kai-Hsuan Lee, Hsinchu (TW); Sai-Hooi Yeong, Zhubei (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 95 days.

(21) Appl. No.: 18/361,429

(22) Filed: Jul. 28, 2023

(65) Prior Publication Data

US 2023/0369098 A1    Nov. 16, 2023

Related U.S. Application Data

(62) Division of application No. 17/329,068, filed on May 24, 2021, now Pat. No. 11,854,868.

(60) Provisional application No. 63/168,034, filed on Mar. 30, 2021.

(51) Int. Cl.
*H01L 21/768* (2006.01)
*H01L 23/528* (2006.01)

(52) U.S. Cl.
CPC .. *H01L 21/76804* (2013.01); *H01L 21/76825* (2013.01); *H01L 21/76877* (2013.01); *H01L 23/5283* (2013.01)

(58) Field of Classification Search
CPC ......... H01L 21/76804; H01L 21/76825; H01L 21/76877; H01L 21/3105; H01L 21/31155; H01L 21/76814; H01L 21/76816; H01L 21/76829; H01L 23/5283; H01L 23/528; H01L 2221/101; H10H 20/8314
See application file for complete search history.

(56) References Cited

U.S. PATENT DOCUMENTS

| 7,001,710 | B2 | 2/2006 | Choi et al. |
| 7,037,822 | B2 | 5/2006 | Cho |
| 10,763,168 | B2 | 9/2020 | Hsieh et al. |
| 2016/0005644 | A1 | 1/2016 | Lee et al. |
| 2016/0125833 | A1 | 5/2016 | Kim |
| 2016/0163711 | A1 | 6/2016 | Arndt et al. |
| 2019/0164828 | A1 | 5/2019 | Khaderbad |
| 2019/0164887 | A1* | 5/2019 | Wang .................. H01L 23/5283 |

(Continued)

FOREIGN PATENT DOCUMENTS

| DE | 102020114875 A1 | 3/2021 |
| JP | H04137624 A | 5/1992 |

(Continued)

*Primary Examiner* — Sue A Purvis
(74) *Attorney, Agent, or Firm* — Slater Matsil, LLP

(57) ABSTRACT

Small sized and closely pitched features can be formed by patterning a layer to have holes therein and then expanding the layer so that the holes shrink. If the expansion is sufficient to pinch off the respective holes, multiple holes can be formed from one larger hole. Holes smaller and of closer pitch than practical or possible may be obtained in this way. One process for expanding the layer includes implanting a dopant species having a larger average atomic spacing than does the material of the layer.

20 Claims, 9 Drawing Sheets

(56) References Cited

U.S. PATENT DOCUMENTS

2019/0371664 A1 12/2019 Wu et al.
2020/0098591 A1* 3/2020 Lin .................... H01L 21/3212

FOREIGN PATENT DOCUMENTS

| JP | H07111241 A | 4/1995 |
| JP | 2005039180 A | 2/2005 |
| KR | 20040008651 A | 1/2004 |
| KR | 20090008954 A | 1/2009 |
| KR | 20160137091 A | 11/2016 |

* cited by examiner

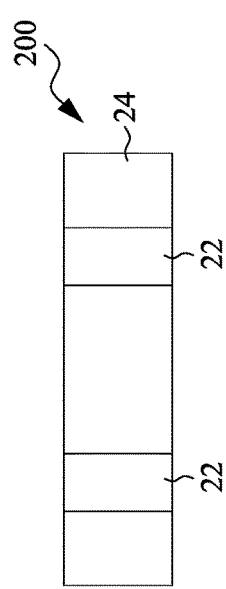
Fig. 2a
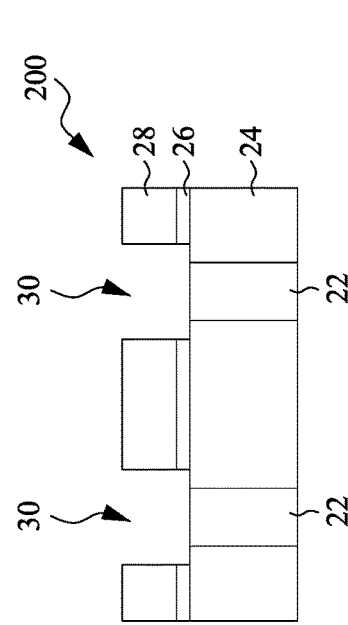
Fig. 2b
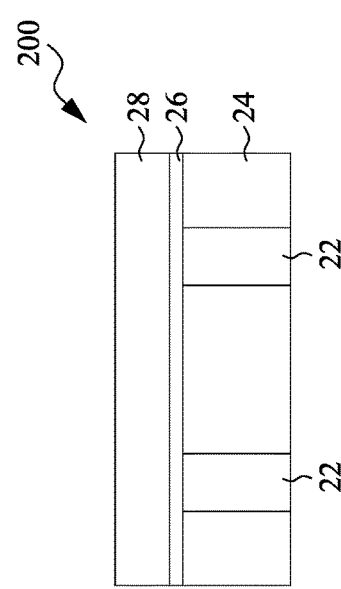
Fig. 2c
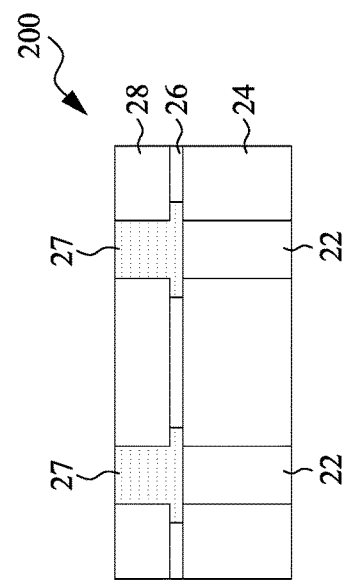
Fig. 2d
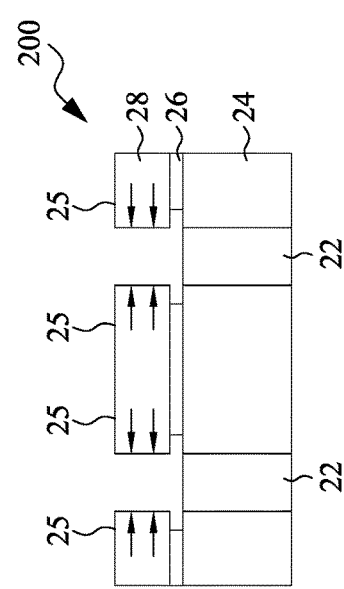
Fig. 2e
Fig. 2f

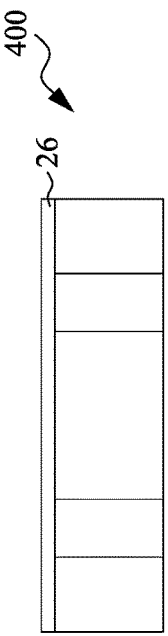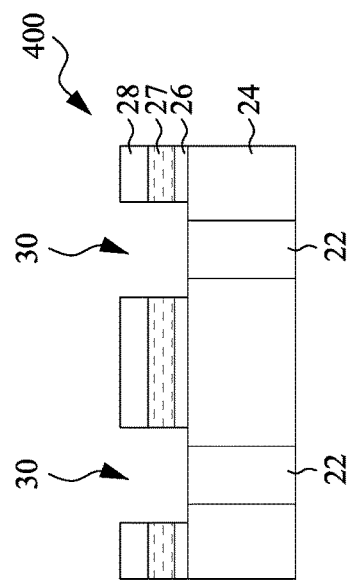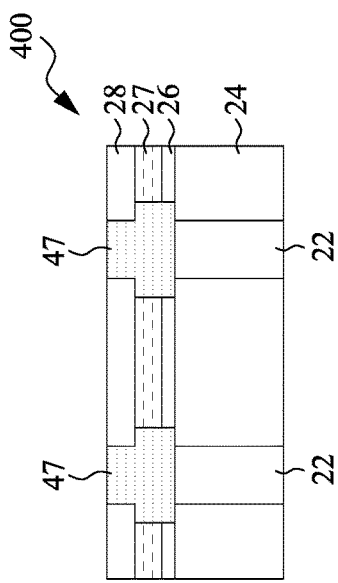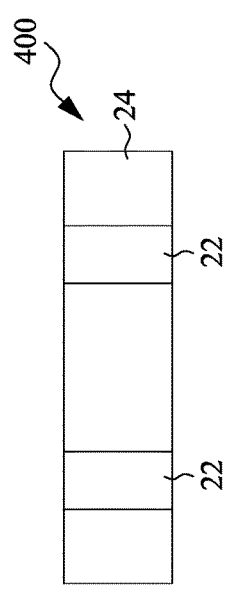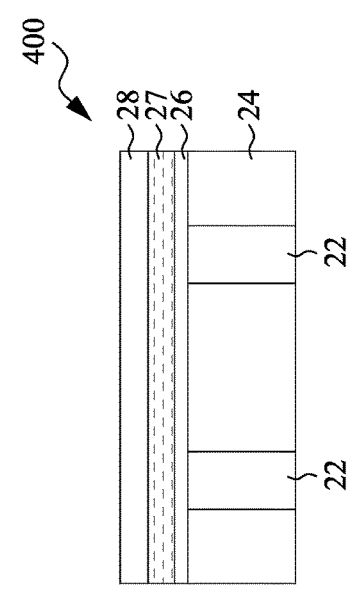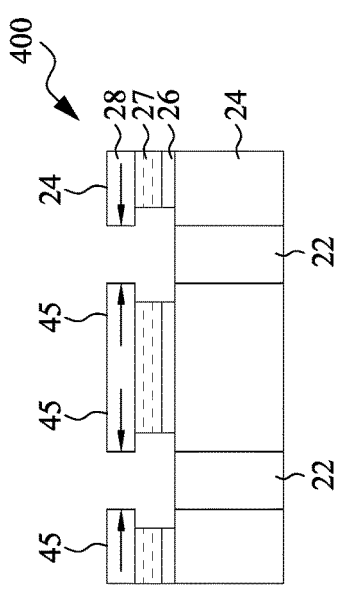

SCALABLE PATTERNING THROUGH LAYER EXPANSION PROCESS AND RESULTING STRUCTURES

PRIORITY CLAIM AND CROSS-REFERENCE

This application is a divisional of U.S. application Ser. No. 17/329,068, filed on May 24, 2021, which claims priority to U.S. Provisional Patent Application No. 63/168,034, filed on Mar. 30, 2021, and entitled "Scalable Via Patterning Method by Ion Implantation for Cost Reduction," which applications are hereby incorporated herein by reference.

BACKGROUND

As critical dimensions in semiconductor processes shrink into the deep sub-micron range, it becomes increasingly difficult to pattern and form small features using conventional techniques such as photolithographic patterning. As an example, conductive vias that electrically connect to gate electrodes, which gate electrodes are manufactured to sub-micron dimensions, must likewise be formed with tight tolerances relating to size and pitch of the vias. Resolution limits of conventional lithography make this difficult to achieve accurately, repeatedly, and economically.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2a through 2f are cross-sectional views of a representative device in intermediate stages of manufacture according to some embodiments described herein.

FIGS. 4a through 4f are cross-sectional views of a representative device in intermediate stages of manufacture according to additional embodiments described herein.

DETAILED DESCRIPTION

Figure 1:
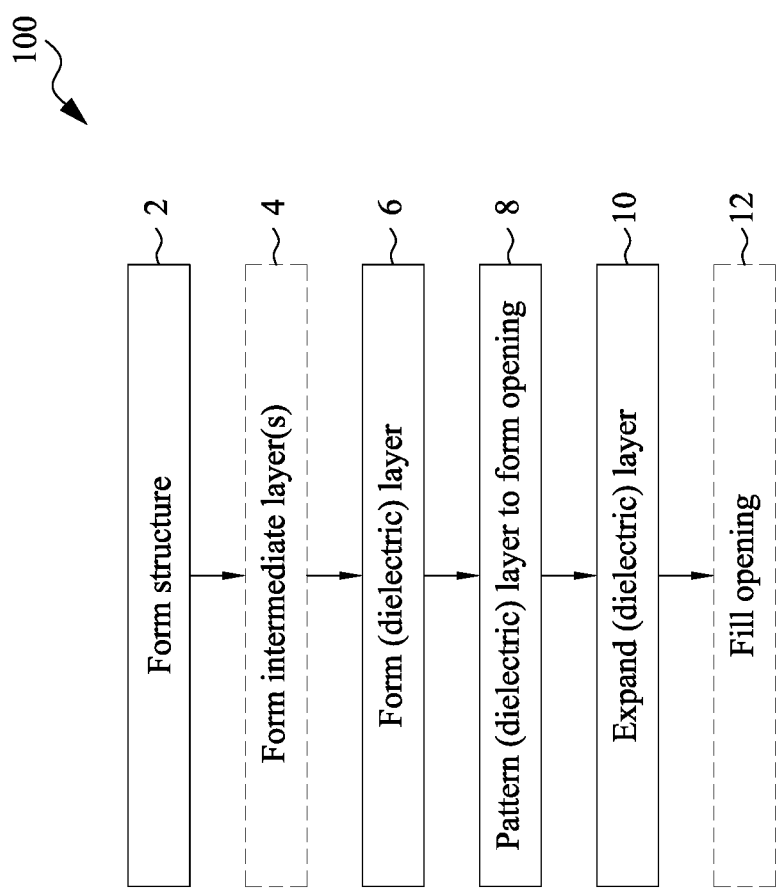
FIG. 1 is a flowchart of a first illustrative process flow.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In the following discussion, like reference numerals are intended to describe like structures, materials, and/or processes, unless it is clear from the context that such was not the author's intent.

Turning now to FIG. 1, which illustrates a flow chart showing major steps in an exemplary method embodiment of the present invention. Method 100, as illustrated in FIG. 1, begins with forming a structure, as represented by method step 2 of method 100. The structure could be a gate electrode in some embodiments, a source/drain region in other embodiments, or some other structure in yet other embodiments. Further, one skilled in the art will recognize that only steps helpful in understanding the presently disclosed embodiments are illustrated in FIG. 1 and that further and additional steps will likely be required to produce actual product before, intermediate, and after the steps illustrated in FIG. 1. After having formed the structure (step 2), an intermediate layer or layers may optionally be formed as represented by step 4. As an example, an etch stop layer, and underlying dielectric layer, or some other layer or layers may be formed, although such layers may also be omitted in some embodiments. Then, as represented by step 6 of method 100, a dielectric layer is formed overlying the structure and/or the intermediate layer or layers. In the specific embodiments discussed in this disclosure, the dielectric layer is an oxide such as a silicon oxide. Those skilled in the art, once informed by the teachings herein, will appreciate that the methods and concepts disclosed herein are applicable to other dielectric layers as well. In fact, the teachings contained herein could be applied to processes for expanding other materials, not just dielectric layers.

Continuing on with the description of method 100 illustrated in FIG. 1, step 8 represents a process of patterning the dielectric layer to form an opening. Step 8 of method 100 is intended to broadly represent patterning processes and could include photolithographic patterning, as is commonly employed in the semiconductor arts, but to also include other techniques such as e-beam lithography, ion milling, contact patterning, and the like. While the present disclosure is not limited to such applications, it is noted that the techniques described herein are particularly advantageous for forming small features, such as openings for vias, contacts, and the like, at small pitches, even more particularly forming openings in the sub-micron and deep sub-micron generations of semiconductor processing. For instance, as will be described in greater detail below, the methods described herein allow for small size patterning with high resolution at or near the limits offered by, e.g., conventional photolithography. This is because, as further explained below, patterns such as an opening can be made at a first size (using, e.g., photolithography) and then the pattern (such as an opening) can be "shrunk" to an even small size by expanding the material of the patterned layer.

After the dielectric layer is patterned (step 8), processing continues with a dielectric layer expansion process as represented by step 10 of method 100 of FIG. 1. Details of exemplary expansion processes will be provided in subsequent paragraphs of this disclosure. In general terms, however, the layer expansion process is one which causes the dielectric layer (or layer of other material) to expand, sometimes referred to as "swelling" or the like. As a result of the expansion of the material, holes (which are surrounded by the material) will "shrink" or be reduced in at least one of and typically all of width, length, and diameter. Advantageously, openings of a fine size and pitch can produce using a patterning technique that could not (practically if not physically) otherwise form such small openings and tight pitches. Hence, complicated techniques such as double-patterning, high resolution masks, extra masks, and the like can be avoided or substantially reduced, potentially reducing manufacturing costs and increasing manufacturing flexibility.

Optionally, once the pattern expansion process (step 10) has been performed and the opening has been appropriately sized, the opening could be filled as represented by step 12. While it is contemplated in the disclosed embodiments that the opening will be filled with conductive material in order to form a via, a contact, a conductive line, or the like, it is within the scope of the present disclosure that a semiconductive or even an insulative material (including air) could be used in some applications to fill the opening.

Turning now to FIGS. 2*a* through 2*f*, further details are provided with regard to one representative embodiment. Starting with FIG. 2*a*, device 200 is illustrated in an intermediate stage of manufacture. In this stage, one or more structures 22 have been formed, corresponding to step 2 of method 100 of FIG. 1. In the embodiment illustrated in FIG. 2*a*, structure 22 is shown embedded in a layer 24. In other embodiments, structure 22 could be formed atop a layer 24. As but one example, structure 22 could be a gate electrode, such as a metal gate embedded within a layer 24, layer 24 being a dielectric layer such as an oxide formed by flowable chemical vapor deposition (FCVD), plasma enhanced chemical vapor deposition (PECVD), or the like. In other embodiments, structure 22 could be a source region or a drain region or some other feature to which it is desired to make physical, electrical, thermal, and/or optical contact, through one or more intervening layers, with a subsequently formed structure or feature. Further although two structures 22 having the same general size and shape are illustrated, it should be apparent that the present teaching applies to one or to several structures, even several million (or more) structures of various sizes and shapes simultaneously formed in a typical integrated circuit manufacturing process, for instance.

Continuing with FIG. 2*b*, an optional intermediate layer 26 is formed, corresponding to step 4 of method 100 of FIG. 1. In one embodiment in which structure 22 is a gate electrode, for instance, intermediate layer 26 could be an etch stop layer such as silicon nitride, silicon oxide, silicon oxynitride, or the like. Then, as illustrated in FIG. 2*c*, a layer 28 is formed atop the intermediate layer 26, if any. In an exemplary embodiment, layer 28 is a dielectric layer such as an inter-level dielectric (ILD) as is commonly employed in semiconductor manufacturing processes, although the present disclosure is not limited to this type of material or application. For sake of clarity, the term layer and dielectric layer will be used interchangeably in this disclosure when referring to layer 28. The intermediate stage of device 200 corresponds to step 6 of method 100 of FIG. 1. As illustrated in FIG. 2*d*, and corresponding to step 8 of method 100 of FIG. 1, dielectric layer 28 is patterned to form opening 30 extending through the layer. Opening 30 extends through intermediate layer 26, if any, as well. One skilled in the art will recognize that, typically, an etch stop layer has high etch selectivity relative to the layer above it, and hence, two or more different etch process/etch chemistries might need to be employed in order to form opening 30 extending through both layer 28 and intermediate 26, depending upon the materials and the etch processes employed. Furthermore, while opening 30 is shown stopping at the interface between intermediate layer 26 and structure 22, in some other embodiments the etch process will over-etch and opening 30 will extend partially into structure 22 as well, and possibly partially into layer 24 as well.

Continuing now with FIG. 2*e*, which corresponds to step 10 of method 100 of FIG. 1, an expansion process is performed on layer 28 to cause layer 28 to expand it— schematically illustrated in FIG. 2*e* by arrows 32. These arrows 32 illustrated that as layer 28 expands it will naturally fill the region of opening 30, as indicated by the direction of arrows 32. As a result of this, the width of opening 30 becomes smaller, i.e. narrower in the direction of the expansion.

In the exemplary embodiment in which layer 28 is a silicon oxide material, the expansion process may entail implanting into layer 28 one or more dopant species, preferably dopant species having an atomic radius larger than, or at least as large as, silicon. In this way, the average atomic spacing of the layer will increase in the region where the dopant species is implanted. Further details regarding illustrative embodiments for the dielectric layer expansion process are provided below.

In the embodiment illustrated in FIG. 2*e*, intermediate layer 26 does not expand as a result of the dielectric layer expansion process. In the current example, silicon nitride is not as susceptible to the dopant species implantation as is layer 28. As a result, opening 30 does not shrink in the region of intermediate layer 26 as it does in the region of layer 28. In some embodiments, intermediate layer is impervious to the expansion process, or is at least substantially impervious to the expansion process relative to layer 28. In other embodiments, as explained below, the expansion process can be tuned so that it does not extend down into intermediate layer 26. In yet other embodiments, the expansion process could expand intermediate layer 26 as well—however an advantageous feature of the illustrated embodiment (perhaps best illustrated by FIG. 2*f*) is that the wider portion of opening 30 extending through intermediate layer 26 means that contact can still be made with structure 22, even if there is some misalignment between opening 30 and structure 22. If the entire opening was shrunk (meaning the entire subsequently formed contact of FIG. 2*f* was also smaller in width and/or diameter), the resulting structure would have a lesser tolerance for misalignment. Finishing with FIG. 2*f* (corresponding to step 12 of method 100 of FIG. 1), opening 30 can optionally be filled with, e.g., conductive material 27 to form a via electrically contacting structure 22. Although illustrated as a unitary material, conductive material 27 could be formed as one or more separate layers of different materials, including liner materials, barrier layers, and the like, to fill opening 30. In an embodiment, material 27 could overfill opening 30 and then be subsequently leveled back to the top of opening 30 through an etch-back process, a chemical mechanical polish (CMP) process, or the like.

Figure 3B:
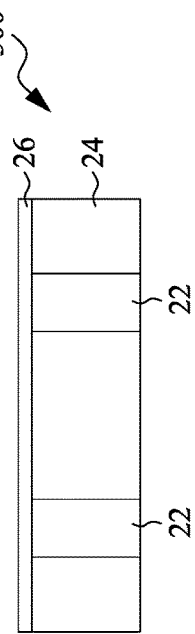
FIGS. 3a through 3f are cross-sectional views of a representative device in intermediate stages of manufacture according to other embodiments described herein.
Figure 3D:
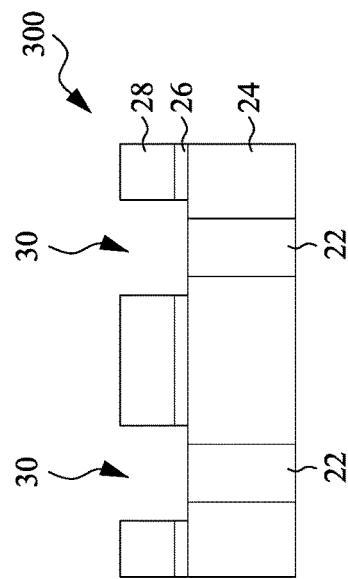
Figure 3F:
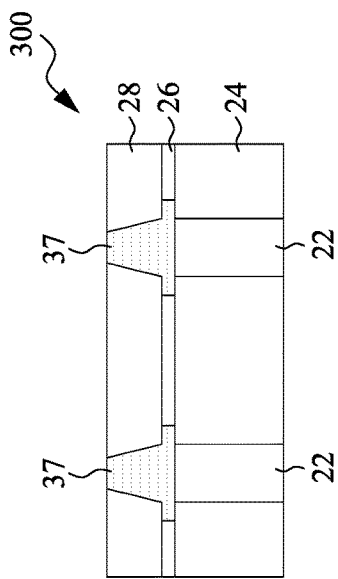
Figure 3A:
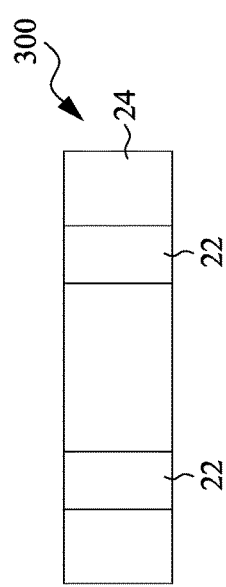
Figure 3C:
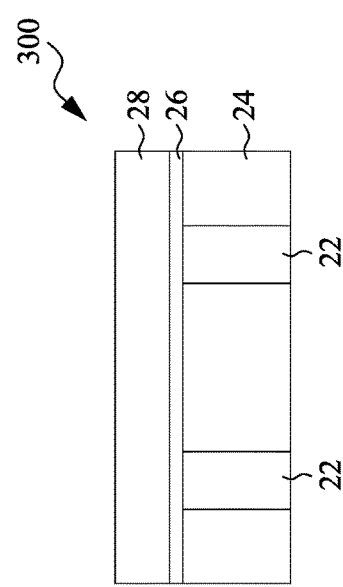

FIGS. 3a through 3d illustrate another illustrative embodiment of the present disclosure. FIG. 3a illustrates a device 300 at the same intermediate stage of manufacture as was device 200 of FIG. 2a, with a structure 22 in a layer 24. Processing illustrated in FIGS. 3b, 3c, and 3d is analogous to the processes illustrated in FIGS. 2b, 2c, and 2d, and hence a detailed discussion of those steps need not be repeated here.

Figure 3E:

FIG. 3e corresponds to step 10 of method 100 of FIG. 1, with the layer expansion process schematically illustrated by arrows 35. In this embodiment, the expansion process is tuned to have a gradient effect on layer 28. In the illustrated example, the expansion process has the greatest impact at the upper portion of layer 28, causing greater expansion in that portion (and resultingly shrinking opening 30 the most in the upper portion) and has the least impact at the lower portion of layer 28, causing lesser expansion in that portion (and correspondingly shrinking opening 30 the least in the lower portion), with a gradient impact between the upper and lower portions. Longer arrows 35 in FIG. 3e schematically represent greater expansion, whereas shorter arrows schematically represent lesser expansion relative to the longer arrows. As an example, the concentration of implanted dopant species can be greatest at the upper portion of layer 28 and least at the lower portion of layer with the concentration gradually decreasing from the upper portion to the lower portion. This will result in the expansion gradient schematically illustrated in FIG. 3e. While opening 30 tapers outward (going from top to bottom) in FIG. 3e, one skilled in the art will recognize that tuning could result if other profiles, such as an inwardly tapered profile or the like. Similarly to the step illustrated in FIG. 2f, FIG. 3f illustrates an example of step 12 of method 100 of FIG. 1, wherein opening 30 is filled with conductive (or other) material 37.

Yet another embodiment process is illustrated in FIGS. 4a through 4f, with the device 400 shown in FIGS. 4a and 4b corresponding, respectively, to the same intermediate stages of manufacture as device 200 shown in FIGS. 2a and 2b. Hence, a detailed discussion of those process steps is not repeated here. Continuing with FIG. 4c, however, in this embodiment an additional layer 27 is formed. In this example, layer 27 is another intermediate layer and hence FIG. 4c (along with FIG. 4b) illustrates an embodiment of step 4 of method 100 of FIG. 1. While not limiting to the scope of the disclosure, in a contemplated embodiment layer 27 is another ILD layer made of silicon oxide. Other materials could, of course, be used instead. Also shown in FIG. 4c is the formation of layer 28, previously discussed, on layer 27 (step 6 of method 100 of FIG. 1). In a contemplated embodiment, layer 27 and layer 28 could each be an oxide such as tetraethylorthosilicate (TEOS) oxide, un-doped silicate glass, or a doped silicon oxide such as borophosphosilicate glass (BPSG), fused silica glass (FSG), phosphosilicate glass (PSG), or boron doped silicon glass (BSG). In other embodiments wherein layer 27 and/or layer 28 is a dielectric, a low-k dielectric material or other suitable dielectric material could likewise be employed. Layers 28 and 27 need not be the same material nor need they be deposited in the same manner, however. Likewise, layers 28 and 27 could be deposited to the same thickness, as shown, or to different thickness.

The process continues with patterning layers 26, 27, and 28 as illustrated in FIG. 4c and corresponding to step 8 of method 100 of FIG. 1. This process step has been described with respect to the embodiment illustrated in FIG. 2d and that description need not be repeated here. One skilled in the art will recognize that depending upon the materials used, layers 27 and 28 could be etched in a single process step or might need two process steps for patterning them. After patterning, a layer expansion process (step 10 of method 100 of FIG. 1) is performed, as schematically illustrated by arrows 45 in FIG. 4e. In this embodiment, the layer expansion process is performed only on layer 28. As a result, layer 28 undergoes expansion (hence narrowing opening 30 as it extends through layer 28), but layer 27 does not undergo expansion (hence opening 30 retains its original or near its original width/diameter as it extends through layer 27). In one example, wherein the expansion process involves implanting dopant species, the implantation process can be tuned so that the dopant species are implanted only into layer 28 and not into layer 27. The result will be a sharp transition between the first width of opening 30 and the second reduced width of opening 30 at the interface between layers 27 and 28. FIG. 4e illustrates an ideal case where layer 27 experiences no expansion. In practice, however, it is possible that at least some dopant species will be implanted in layer 27 and hence layer 27 will experience some expansion. While two layers 27 and 28 are illustrated in FIGS. 4c through 4f, one skilled in the art will recognize that three or more layers could be employed with varying levels of expansion (or lack thereof) resulting from one or more expansion processes being performed on them (either simultaneously or serially). As with the prior embodiments, after the expansion process opening 30 can optionally be filled such as with conductive material 47 illustrated in FIG. 4f.

Figure 5B:
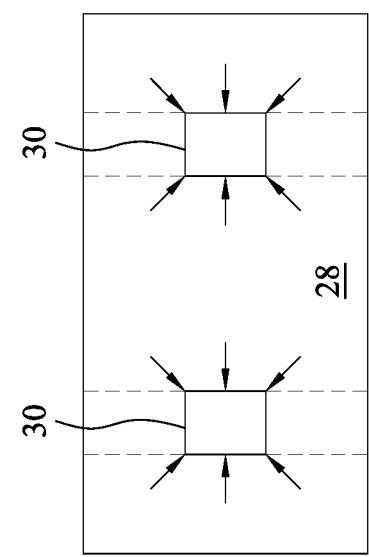
FIGS. 5a through 5d are top down views of a representative device illustrating embodiments of layer expansion.
Figure 5D:
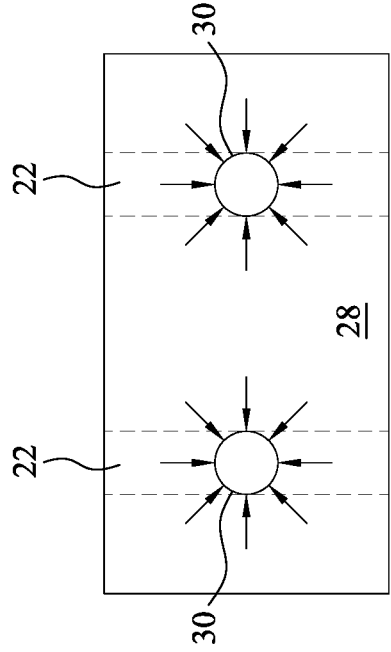
Figure 5A:
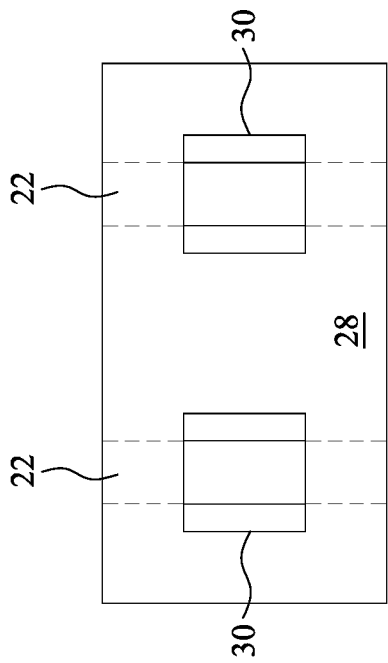
Figure 5C:
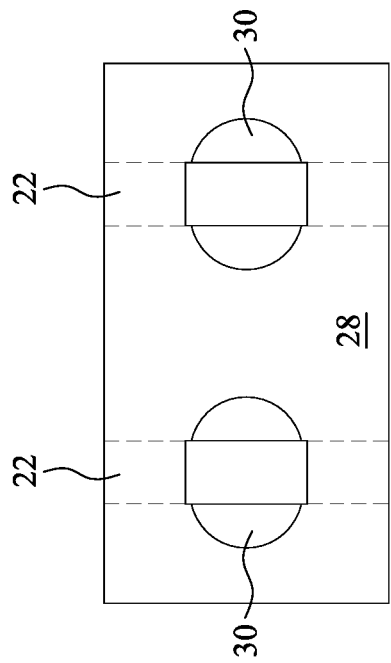

Those skilled in the art will recognize that FIG. 2e is a cross-sectional view of a three-dimensional object. In the actual device, expansion of layer 32 will occur in all directions, meaning that the "width" of opening 30 will decrease in all directions. Another way to express this is that the "diameter" in all directions of opening 30 will decrease (whether opening 30 is technically circular, or elliptical or ovoid, or even a polygon or irregularly shaped). Of course, depending upon the material of layer 28 and the shape (when viewed in plan view) of opening 30 the amount by which opening 30 "shrinks" (i.e. the amount by which layer 28 expands) might not be the same in all directions. In other words, in some embodiments, opening 30 might shrink by a greater amount in an "x" direction relative to a "y" direction. FIGS. 5a through 5c, which respectively illustrative openings 30 in plan view to illustrate this. For instance, FIG. 5a illustrates layer 28 having a rectangular opening 30 extending through it. Structure 22 is visible through opening 30 and is obscured by layer 28 as indicated by the dotted lines in the figure. FIG. 5a illustrates in plan view any one of device 200, 300, or 400 as illustrated in FIGS. 2d, 3d, and 4d, respectively. In this case, opening 30 is rectangular in shape when viewed in a top-down view. By comparison, FIG. 5b illustrates the same device (corresponding to FIGS. 2e, 3e, and 4e, respectively) after the layer expansion process is performed as indicated by the arrows in the figure. As a result, layer 28 has expanded and consequently opening 30 has shrunk in at least one direction. As discussed above, the shrink might be relatively symmetrical amongst all the sides of a rectangle or polygon or, as illustrated, the reduction is width might be greater in one direction relative to another direction.

As another example, FIG. 5c illustrates generically device 200, 300, or 400 in the stage of manufacture illustrated in FIG. 2d, 3d, or 4d, respectively. In this example, opening 30 is circular when viewed in a top-down view. Again, after the layer expansion process (FIG. 2e, 3d, or 4e, respectively), layer 28 has expanded and opening 30 has had its diameter reduced. This is illustrated in FIG. 5d. Because the opening is circular, the diameter will likely, but not necessarily be reduced symmetrically.

It should be noted that in the above illustrations, particularly FIGS. 2d, 3d, and 4d, and 2e, 3e, and 43, opening 30 is illustrated as having substantially vertical sidewalls. This is an ideal case for a perfectly anisotropic etch process to pattern layer 28. In practice, it is likely that the sidewalls of opening 30 will taper in slightly (proceeding from top to bottom) due to the non-ideal characteristics of the patterning process. Some slope in the sidewalls, both before and after the layer expansion process, is within the contemplated scope of the present disclosure.

Turning now to FIGS. 6 and 7A through 7i, another embodiment will be described wherein multiple individual openings can be formed from a patterned layer having only a single opening therein by selectively expanding portion of the patterned layer. Starting with FIG. 6, which provides a flow chart illustrating relevant steps in the illustrative method 150, steps 2 through 8 and 12 are, essentially, the same as steps 2 through 8 illustrated and described above with respect to method 100 of FIG. 1. Steps 9, 10*, and optional step 11 differ, however, from the process of method 100.

Step 9 involves masking one or more portions of the dielectric layer after it has been patterned. This masking could involve depositing and then patterning a photoresist material using photolithographic techniques, as is conventionally used in the semiconductor arts. Alternatively, the masking could involve depositing a hard mask layer (e.g., silicon nitride, silicon oxide, or the like) on the dielectric layer and then (again using photolithography, e-beam, or the like) patterning the hard mask layer to form the masking layer. Regardless of the technique employed, the goal of the masking step is to mask or protect portions of the underlying layer while leaving other portions of the underlying layer exposed to a subsequent layer expansion process (step 10*). Further details of the masking process will be described below with respect to FIGS. 7a through 7i.

Figure 6:
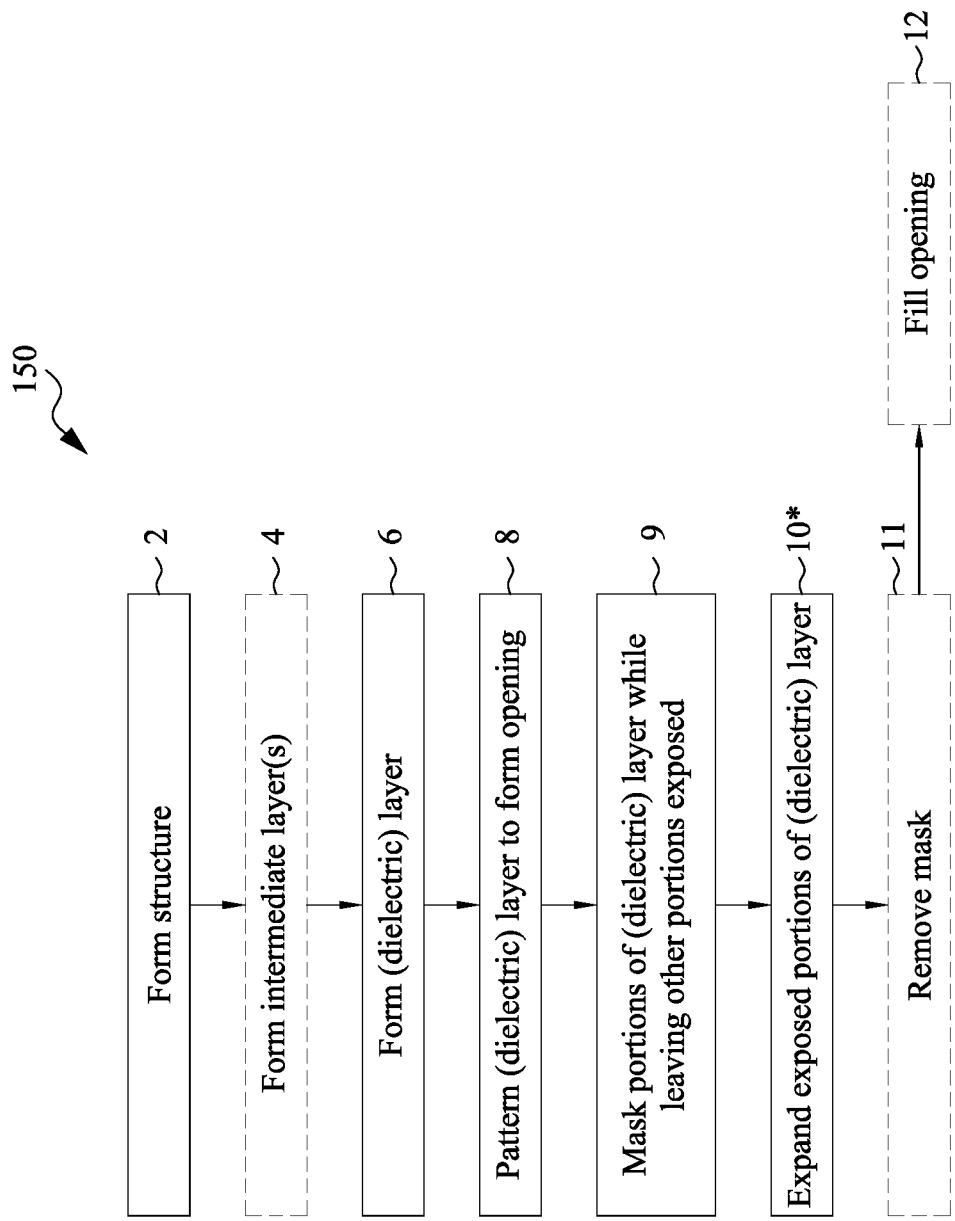
FIG. 6 is a flowchart of a second illustrative process flow.

Continuing with method 150 of FIG. 6, in step 10 the portions of the underlying layer left un-masked (exposed) in step 9 are subjected to a layer expansion process. As will be described in greater detail below, in some embodiments the layer expansion process involves implanting dopant species into the exposed portions. One skilled in the art will recognize that implantation is typically a blanket process with the entire substrate being subjected to implantation. This is where the mask layer comes into play. By being thick enough or impervious enough, the mask layer absorbs or otherwise blocks the dopant species from being implanted into the layer underlying the mask layer. The impact of selective implantation of dopant species and the concomitant selective expansion of the underlying layer will be address in further detail below. FIG. 6 also shows an optional step 11 wherein the mask layer is removed. Presumably, when the mask layer is a polymer, photoresist, or the like, it will be removed before subsequent layers are formed atop the patterned and expanded layer. In other embodiments, however, when a silicon oxide or similar such hard mask layer is used, it may be desirable to incorporate that layer into the insulating layer (e.g., as part of the ILD layer) rather than to remove it. Completing the description of method 150 of FIG. 6, optional step 12 involves filling the opening, as was discussed above with respect to step 12 of method 100 of FIG. 1.

Figure 7A:
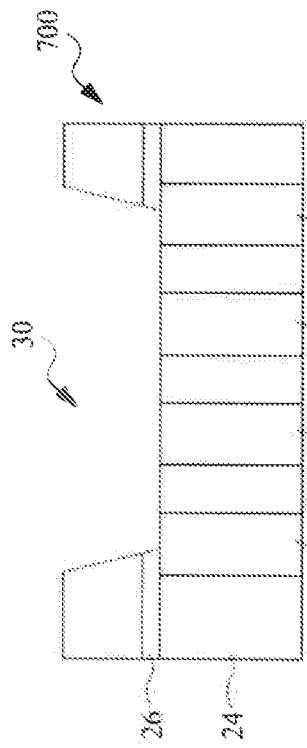
FIGS. 7a through 7i are cross-sectional views of a representative device in intermediate stages of manufacture according to yet other embodiments described herein.
Figure 7B:
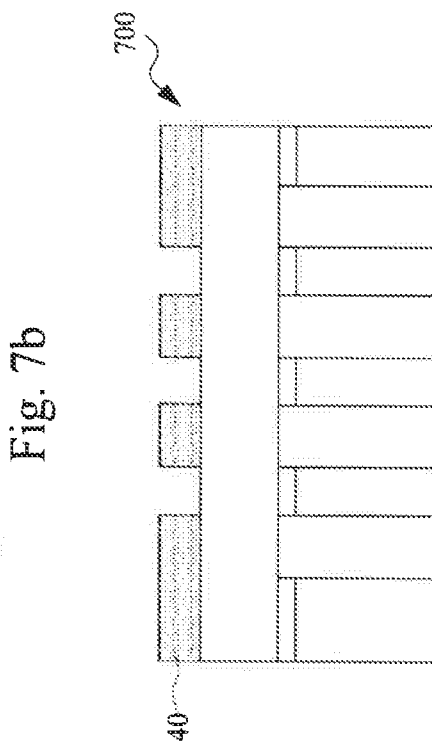

Turning now to FIGS. 7a through 7i, which illustrate yet another embodiment, and more specifically an embodiment in which a single relatively large opening can be turned into a plurality of separate, smaller openings using the layer expansion methods described herein. Even more specifically, a method for performing the layer expansion process on selected portions of the layer is disclosed in this embodiment. FIG. 7a illustrates in plan view (i.e. top-down view) a device 700 at an intermediate state of manufacture similar to the stage of manufacture of device 200 of FIG. 2d. In other words, a structure 22 has been formed (corresponding to step 2 of method 150 of FIG. 6), an intermediate layer 26 has been formed (corresponding to step 4 of method 150 of FIG. 6), a layer 28, in this case a dielectric layer, has been formed over the intermediate layer and patterned to form hole 30 (corresponding to steps 6 and 8, respectively, of method 150 of FIG. 6). Structure 22 can be seen in the top-down view where they are exposed by hole 30, but otherwise structure 22 is obscured by overlying layer 28, as indicated by the dotted line outlining the structure in FIG. 7a. FIG. 7b illustrates device 700 in cross-sectional view along the cross-section indicated by the line B-B in FIG. 7a. Note that, unlike the previous embodiments, hole 30 is larger than a single contact or via necessary to make contact with a structure 22. In the embodiment illustrated in FIGS. 7a and 7b, hole 30 actually exposes four separate structures 22. This allows for less stringent resolution concerns when patterning layer 28/forming hole 30.

Figure 7C:
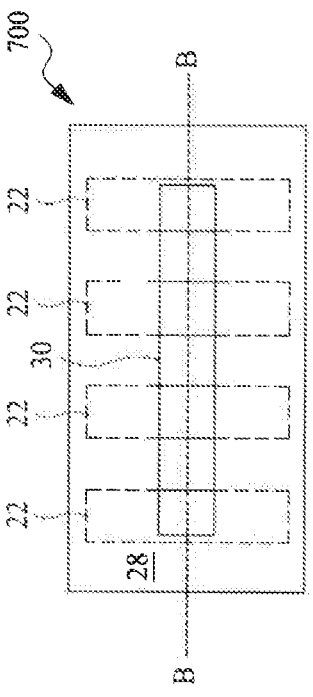
Figure 7D:
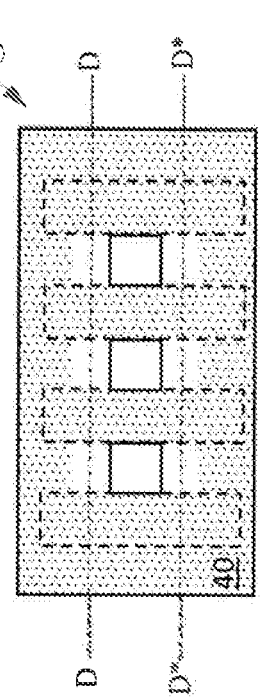
Figure 7E:
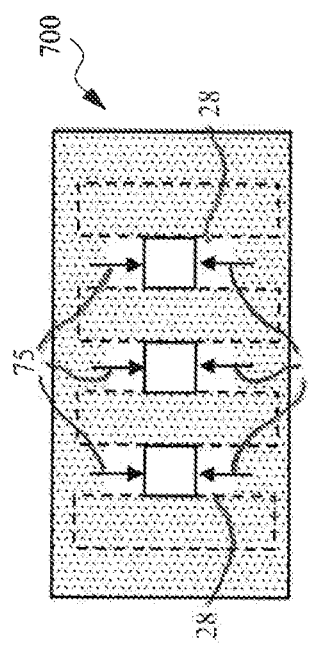

Corresponding to step 9 of method 150 of FIG. 6, a mask 40 is formed over layer 28. This mask 40 is shown in plan view in FIG. 7c and shown in cross-sectional view in FIG. 7d. Note that FIG. 7d illustrates the cross section of device 700 along the cross-section indicated by line D-D in FIG. 7c. Note also that this same cross-sectional view would be obtained along the cross-section indicated by line D*-D* in FIG. 7c, as device 700 is symmetrical. As addressed above, mask layer 40 could be a patterned photoresist layer, a hard mask layer of silicon oxide, silicon nitride, silicon oxynitride, or the like, or any other suitable material. As FIGS. 7c and 7d illustrate, portions of layer 28 are covered by mask layer 40 while other portions of layer 28 are left uncovered. These uncovered portions are then exposed to a layer expansion process, corresponding to step 10* of method 150 of FIG. 6. As illustrated in FIG. 7e (top-down view), the layer expansion process is applied only to those selected portions of layer 28 that are left exposed by mask layer 40. Arrows 75 of FIG. 7e schematically illustrate the results of the layer expansion process wherein layer 28 expands into the available space of hole 30. When hold 30 is relatively thin in the direction of arrows 75, it is possible that layer 28 can expand enough to bridge across hole 30. Stated another way, the selectively expanded layer 28 can "pinch off" hole 30 and form two or more separated holes. While it is possible to pinch off hole 30 using the blanket expansion process described with reference to, e.g., FIGS. 2a through 2f by sufficiently expanding layer 28, expanding the entire layer 28 in that way could cause the resulting expanded layer 28 to be under excessive strain, which could lead to buckling, delamination, and the like. Hence, an advantageous feature of the embodiment illustrated in FIGS. 6 and 7a through 7i is that selected portions of layer 28 can be subjected to a level of expansion greater than that which could practically be obtained if the entire layer 28 was subjected to the expansion process.

Figure 7F:
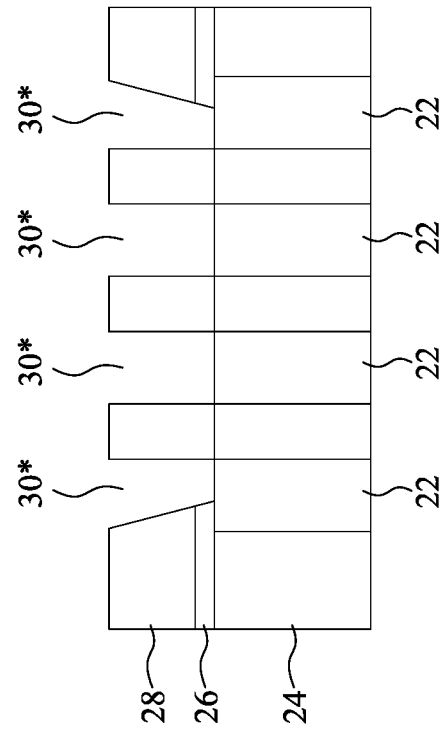
Figure 7G:
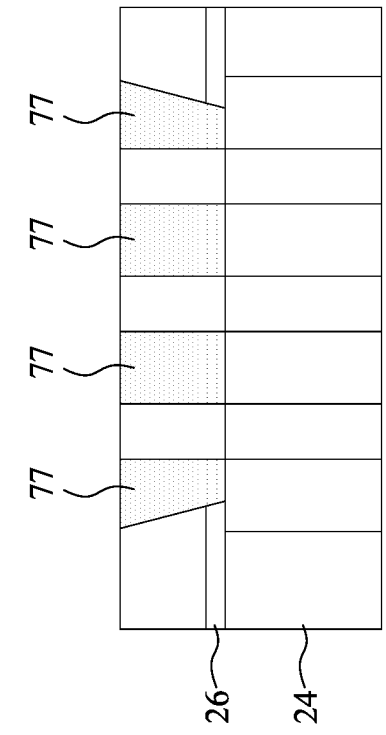
Figure 7H:
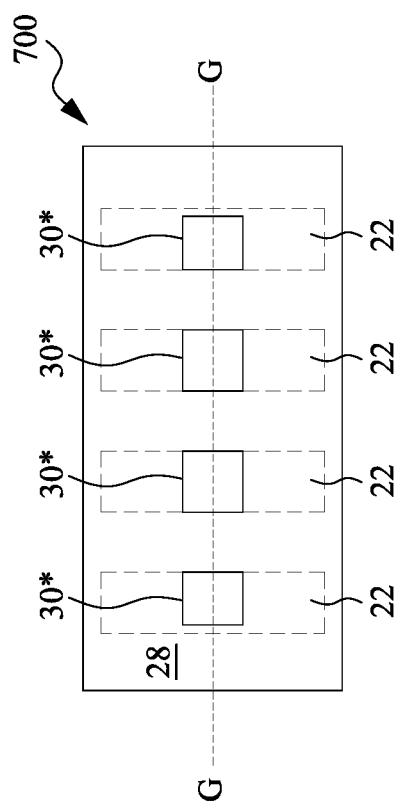

Continuing with the process, FIGS. 7f and 7g illustrate device 700 after the layer expansion process is completed and masking layer 40 has been (optionally) removed, corresponding to step 11 of method 150 of FIG. 6. In the illustrated embodiment portions of hole 30 have been entirely pinched off due to the expansion of layer 30—resulting in multiple sub-holes 30*. Each sub-hole is aligned with an underlying structure in the illustrated case. Note that the pitch sub-holes 30* is less than the pitch between adjacent holes 30 (only one such hole 30 is illustrated, but since the four sub-holes 30* fit within the perimeter of original hole 30, the pitch is self-evidently less). Hence, this process allows for the manufacture of sub-holes 30 that are smaller and of closer pitch than may be possible with conventional patterning processes. Finally, and optionally, sub-holes 30* can be filled with, e.g., conductive material to form vias 77 for electrical connection of structure 22 to subsequently formed devices and features. This is illustrated in FIG. 7i and corresponding to step 12 of method 150 of FIG. 6.

Figure 7I:
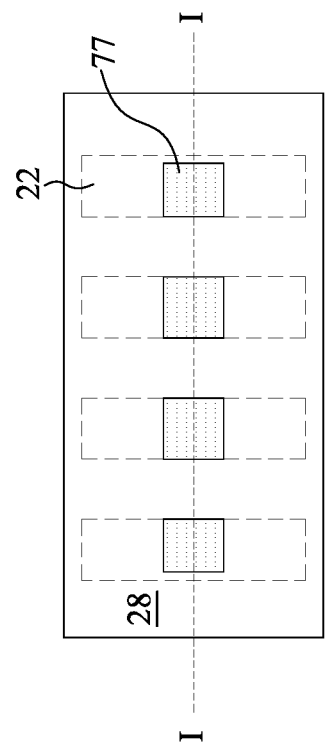

Note that in FIGS. 7b, 7g, and 7i, the sidewalls of hole 30 and outer holes 30* are shown as sloping outwards (proceeding from bottom to top) as a result of non-ideal etch processes. The slope is shown highly exaggerated in this case simply for purposes of illustration.

Figure 8B:
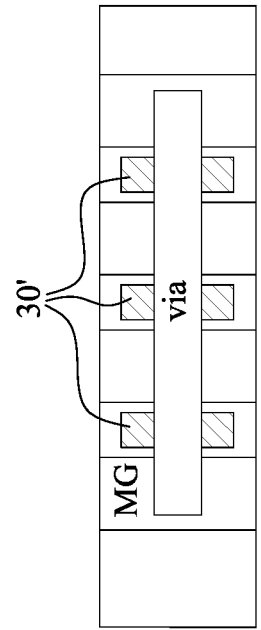
FIGS. 8a and 8b are top-down views of a representative device in an intermediate stage of manufacture and illustrate alternative methods of selectively expanding multiple portions of an exemplary dielectric layer.
Figure 8A:
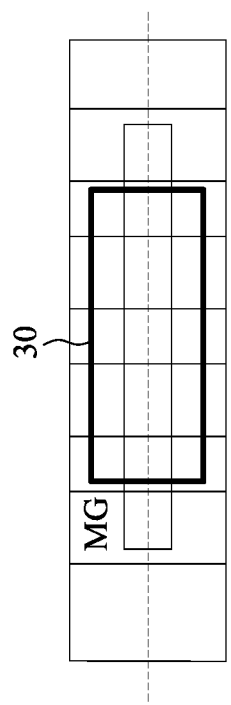

FIGS. 8a and 8b illustrate alternative approaches to selectively expanding portions of an underlying dielectric layer. In FIG. 8a, a single large hole 30 is formed. This single large hole 30 exposes multiples portions of layer 28, as well as exposing portions of structure(s) 22. Note, however, that structure 22 will not expand as a result of the implantation process (because of the different properties and materials of structure 22), and hence the subsequent implantation and expansion processes will only affect the exposed regions of layer 28 and not the exposed regions of structure 22. This allows for a larger hole 30 to be used, with concomitant increase in alignment windows and relaxed process tolerances. On the other hand, as illustrated by FIG. 8b, it is also within the contemplated scope of the present disclosure that numerous hold 30' could be employed to ensure that only the portions of layer 28 that are desired to be expanded will be exposed to the implantation process. While more precise in some respect, the process shown in FIG. 8b will be more costly to implement, as the holes 30' will be smaller than hole(s) 30 of FIG. 8a.

The above embodiments describe various ways in which ion implantation is used to expand or selectively expand a layer 28 such as a dielectric oxide layer. As addressed above, the dopant species is preferably an atomic (or molecular) species having an atomic radius at least as great as silicon, such as Ge, Ar, Xe, Si, and the like, and combinations thereof. One skilled in the relevant art will be able to determine optimum implantation parameters once informed by the present disclosure and with exercise of routine experimentation. As a guide, however, an implantation energy in the range of from about 0.5K eV to about 50 K eV per dose should be an acceptable starting point for many contemplated applications. Depending upon the desired projection depth for the implantation, a dose ranging between about $10^{13}$ and $10^{16}$ atoms/cm$^2$ is likely sufficient, with a resulting dopant concentration of from about $10^{19}$ to about $10^{22}$ atoms/cm$^3$ currently considered to be an acceptable target range for many applications. A higher dose can drive the implanted species deeper depending upon the thickness of the layers being expanded and any layers overlying same. Other variables and optimization thereof will be apparent to those skilled in the art, such as varying the implant angle from a vertical axis to up to about 60 degrees, and varying the implantation temperature, perhaps in the range of about −100 C to about 450 C. While not limiting the scope of the present disclosure, it is contemplated that a degree of expansion of about 3% to about 7% is obtainable.

One skilled in the art will appreciate that the implant dosage need not remain constants. For instance, for a gradient expansion the implant dosage can likewise be implanted at a gradient so that the overall concentration of implanted species (and hence the resulting amount of expansion of the layer) can likewise be at a gradient. In this way, the hole can be shrunk and the resulting shrunken hole can have inwardly or outwardly sloping sidewalls. Similarly, a gradient expansion profile can also be obtained through a series of implantation steps at different dosages and dopant concentrations.

Additional benefit or at least additional flexibility can be realized through the use of a tilt angle implantation process. Taking the vertical axis, relative to the major surface of layer 28, as 0 degrees, in some embodiments it may be desirable to tilt the angle of implantation away from 0 degrees, e.g. to avoid shadowing from adjacent structures, to further control implant depth, and the like. While not a limitation on the processes disclosed herein, a tilt angle of anywhere between 0 degrees and 60 degrees would likely suffice for most applications. Additionally, as with many processes used in semiconductor processing, the process temperature can also impact the process and resulting expansion. While not a limitation on the processes disclosed herein, a temperature of from about −200 C to about 500 C, and preferably between about −100 C and 450 C would probably suffice for most applications and will minimize or at least reduce the potential for damage to the device arising from excessive heat.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

One general aspect of the embodiments disclosed herein includes a method of manufacturing a semiconductor device, forming a dielectric layer on a structure. The method of manufacturing also includes forming an opening in the dielectric layer to expose a top surface of the structure, where the opening has a first width in the dielectric layer. The method of manufacturing also includes performing an expansion process on the dielectric layer to shrink the first width of the opening in the dielectric layer.

Another general aspect of the embodiments disclosed herein includes a method of manufacturing a semiconductor device, forming a first dielectric layer on a structure. The method of manufacturing also includes forming a second dielectric layer on the first dielectric layer. The method of manufacturing also includes forming an opening in the first dielectric layer and the second dielectric layer to expose a top surface of the structure, where the opening has a first width in the second dielectric layer. The method of manufacturing also includes performing an expansion process on the second dielectric layer to shrink the first width of the opening to a second width in the second dielectric layer.

Yet another general aspect of the embodiments disclosed herein includes a device having a structure. The device includes an etch stop layer over the structure. The device also includes a first dielectric layer over the etch stop layer. The device also includes a second dielectric layer over the first dielectric layer. The device also includes an interface between the first dielectric layer and the second dielectric layer. The device also includes a conductive via extending from a topmost surface of the second dielectric layer through the first dielectric layer and the etch stop layer, and electrically contacting the structure, the conductive via having a first width in the first dielectric layer and a second width, less than the first width, in the second dielectric layer and having an abrupt transition between the first width and the second width. The device also includes a dopant species in the second dielectric layer.

One general aspect also includes a structure. The device also includes an etch stop layer over the structure. The device also includes a first dielectric layer over the etch stop layer. The device also includes a second dielectric layer over the first dielectric layer. The device also includes an interface between the first dielectric layer and the second dielectric layer. The device also includes a conductive via extending from a topmost surface of the second dielectric layer through the first dielectric layer and the etch stop layer, and electrically contacting the structure, the conductive via having a first width in the first dielectric layer and a second width, less than the first width, in the second dielectric layer and having an abrupt transition between the first width and the second width. The device also includes and a dopant species in the second dielectric layer.

Another general aspect also includes a structure. The device also includes a first dielectric layer on the structure. The device also includes a second dielectric layer on the first dielectric layer. The device also includes a conductive via extending through the second dielectric layer and through the first dielectric layer and contacting the structure. The device also includes where a first region of the second dielectric layer at least partially surrounds the conductive via and has a first average atomic spacing, a second region of the second dielectric layer has a second average atomic spacing less than the first average atomic spacing. The device also includes and where the cross-sectional width of the conductive via abruptly transitions from a first cross-sectional width value to a second greater cross-sectional width value at an interface between the first dielectric layer and the second dielectric layer.

Yet another general aspect also includes a contact structure embedded in a dielectric layer. The device also includes a conductive via physically contacting the contact structure, the conductive via being embedded in at least one first dielectric layer and at least one second dielectric layer, the conductive via having a first cross-sectional width value at an interface between the first at least one dielectric layer and the second at least one dielectric layer, having a second cross-sectional width value greater than the first cross-sectional width value at an interface between the first at least one dielectric layer and the contact structure, and having a third cross-sectional width value less than the first cross-sectional width value at a top of the second at least one dielectric layer, the cross-sectional width of the conductive via transitioning smoothly from the first cross-sectional width value to the third cross-sectional width value and transitioning abruptly from the first cross-sectional width value to the second cross-sectional width value. The device also includes and where an average atomic spacing of the second at least one dielectric layer has a first average atomic spacing value at the interface between the second at least one dielectric layer and the first at least one dielectric layer and has a second average atomic spacing value less than the first average atomic spacing value at the top of the second at least one dielectric layer, the average atomic spacing of the second at least one dielectric layer transitioning smoothly from the first average atomic spacing value to the second average atomic spacing value.

What is claimed is:

1. A device comprising:
   a structure;
   an etch stop layer over the structure;
   a first dielectric layer over the etch stop layer;
   a second dielectric layer over the first dielectric layer;
   an interface between the first dielectric layer and the second dielectric layer;
   a conductive via extending from a topmost surface of the second dielectric layer through the first dielectric layer and the etch stop layer, and electrically contacting the structure, the conductive via having a first width in the first dielectric layer and a second width, less than the first width, in the second dielectric layer and having an abrupt transition between the first width and the second width; and
   a dopant species in the second dielectric layer, wherein the second dielectric layer has a first average atomic spacing in a first region surrounding the conductive via and a second average atomic spacing, less than the first average atomic spacing, in a second region apart from the conductive via.

2. The device of claim 1, wherein the conductive via further has a third width, less than the first width and the second width, in the second dielectric layer and has a gradual transition from the second width to the third width.

3. The device of claim 2, wherein the third width is at an interface between the first dielectric layer and the second dielectric layer.

4. The device of claim 1, wherein the first region of the second dielectric layer is doped with a dopant species selected from the group consisting of Ge, Ar, Xe, Si, and combinations thereof.

5. The device of claim 4, the dopant species having an atomic radius at least as great as the atomic radius of silicon.

6. The device of claim 1, wherein the first region of the second dielectric layer includes a dopant species therein, and the second region of the second dielectric layer is free of the dopant species.

7. The device of claim 6, wherein a concentration of the dopant species decreases from a top surface of the second dielectric layer to a bottom surface of the second dielectric layer.

8. A device comprising:
   a structure;
   a first dielectric layer on the structure;
   a second dielectric layer on the first dielectric layer;
   a conductive via extending through the second dielectric layer and through the first dielectric layer and contacting the structure;
   wherein a first region of the second dielectric layer at least partially surrounds the conductive via and has a first average atomic spacing, and further wherein a second region of the second dielectric layer laterally surrounds the first region of the second dielectric layer and has a second average atomic spacing less than the first average atomic spacing; and wherein a cross-sectional width of the conductive via abruptly transitions from a first cross-sectional width value to a second greater cross-sectional width value at an interface between the first dielectric layer and the second dielectric layer.

9. The device of claim 8, wherein the first region of the second dielectric layer includes a dopant species therein, the dopant species having an atomic radius at least as great as the atomic radius of silicon.

10. The device of claim 8, wherein the concentration of dopant species in the second dielectric layer has a first value at the top of the second dielectric layer and has a second value at the bottom of the second dielectric layer, and wherein the concentration value transitions smoothly from the first value to the second value.

11. The device of claim 8, wherein:
the concentration of dopant species in the second dielectric has a first value at the top of the second dielectric layer and has a second value at the bottom of the second dielectric layer, and wherein the value transitions smoothly from the first value to the second value; and
the cross-sectional width of the conductive via has a third cross-sectional width value at the top of the second dielectric layer, and wherein the cross-sectional width of the conductive via transitions smoothly from the first cross-sectional width value to the third cross-sectional width value.

12. The device of claim 8, wherein:
the concentration of dopant species in the second dielectric has a first concentration value at the top of the second dielectric layer and has a second concentration value at the bottom of the second dielectric layer, and wherein the concentration of dopant species transitions smoothly from the first concentration value to the second concentration value;
the cross-sectional width of the conductive via has a third cross-sectional width value at the top of the second dielectric layer and, wherein the cross-sectional width of the conductive via transitions smoothly from the first cross-sectional width value to the third cross-sectional width value; and
a ratio of the first concentration value to the second concentration value is equal to a ratio of the third cross-sectional width value to the first cross-sectional width value.

13. The device of claim 12, wherein the first concentration value is greater than the second concentration value.

14. The device of claim 12, wherein the conductive via is vertically mis-aligned to the structure at the region of the conductive via having the third cross-sectional width value, and is vertically aligned with the structure at the region of the conductive via having the second cross-sectional width value.

15. The device of claim 12, wherein the conductive via is vertically mis-aligned to the structure at the region of the conductive via having the third cross-sectional width value and the region of the conductive via having the first cross-sectional width value, and is vertically aligned with the structure at the region of the conductive via having the second cross-sectional width value.

16. The device of claim 12, wherein the structure is a terminal selected from the group consisting of a transistor gate contact, a transistor source contact, and a transistor drain contact.

17. The device of claim 12, wherein the second dielectric layer comprises silicon oxide.

18. A device comprising:
a contact structure embedded in a dielectric layer;
a conductive via physically contacting the contact structure, the conductive via being embedded in at least one first dielectric layer and at least one second dielectric layer, the conductive via having a first cross-sectional width value at an interface between the first at least one dielectric layer and the second at least one dielectric layer, having a second cross-sectional width value greater than the first cross-sectional width value at an interface between the first at least one dielectric layer and the contact structure, and having a third cross-sectional width value less than the first cross-sectional width value at a top of the second at least one dielectric layer, the cross-sectional width of the conductive via transitioning smoothly from the first cross-sectional width value to the third cross-sectional width value and transitioning abruptly from the first cross-sectional width value to the second cross-sectional width value; and
wherein an average atomic spacing of the second at least one dielectric layer has a first average atomic spacing value at the interface between the second at least one dielectric layer and the first at least one dielectric layer and has a second average atomic spacing value less than the first average atomic spacing value at the top of the second at least one dielectric layer, the average atomic spacing of the second at least one dielectric layer transitioning smoothly from the first average atomic spacing value to the second average atomic spacing value.

19. The device of claim 18, wherein the at least one second dielectric layer includes a region with a dopant species therein, the dopant species having an atomic radius as great or greater than the atomic radius of silicon.

20. The device of claim 19, wherein the region surrounds the conductive via.

* * * * *